(12) United States Patent
Huang

(10) Patent No.: US 8,942,024 B2
(45) Date of Patent: Jan. 27, 2015

(54) CIRCUIT ARRANGEMENT AND A METHOD OF WRITING STATES TO A MEMORY CELL

(71) Applicant: Agency for Science, Technology and Research, Singapore (SG)

(72) Inventor: Kejie Huang, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 52 days.

(21) Appl. No.: 13/707,442

(22) Filed: Dec. 6, 2012

(65) Prior Publication Data

US 2014/0003126 A1 Jan. 2, 2014

Related U.S. Application Data

(60) Provisional application No. 61/567,157, filed on Dec. 6, 2011.

(51) Int. Cl.
*G11C 13/00* (2006.01)
(52) U.S. Cl.
CPC ........ *G11C 13/0069* (2013.01); *G11C 13/0064* (2013.01); *G11C 2013/0066* (2013.01); *G11C 2213/79* (2013.01)
USPC ....... 365/148; 365/158; 365/163; 365/189.16
(58) Field of Classification Search
CPC ........... G11C 13/0069; G11C 13/0064; G11C 13/0002; G11C 2013/0002; G11C 13/0071; G11C 2013/0009; G11C 2013/0066; G11C 2213/79
USPC ............................. 365/148, 158, 163, 189.16
See application file for complete search history.

(56) References Cited

U.S. PATENT DOCUMENTS

| | | | |
|---|---|---|---|
| 6,891,749 B2 * | 5/2005 | Campbell et al. | 365/163 |
| 7,884,699 B2 * | 2/2011 | Hosoi | 338/22 R |
| 7,965,539 B2 * | 6/2011 | Osano et al. | 365/148 |
| 7,990,754 B2 * | 8/2011 | Azuma et al. | 365/148 |
| 8,023,312 B2 * | 9/2011 | Yamazaki et al. | 365/148 |
| 8,223,565 B2 * | 7/2012 | Ueda | 365/189.16 |
| 8,446,754 B2 * | 5/2013 | Kim | 365/148 |
| 8,446,756 B2 * | 5/2013 | Shiimoto et al. | 365/163 |

* cited by examiner

*Primary Examiner* — Tan Nguyen
(74) *Attorney, Agent, or Firm* — Blakely, Sokoloff, Taylor & Zafman LLP

(57) ABSTRACT

A method of writing a first state or a second state to a memory cell may be provided. Writing the first state to the memory cell may include electrically connecting a first switch in electrical connection to a first end of the memory cell to a first voltage and electrically connecting a second switch in electrical connection to a second end of the memory cell to a fourth voltage to apply a first potential difference to cause formation of the first state in the memory cell. Writing the second state to the memory cell may include electrically connecting the first switch to the second voltage and electrically connecting the second switch to the third voltage to apply a second potential difference to cause formation of the second state in the memory cell.

16 Claims, 16 Drawing Sheets

Providing a potential difference across a first end and a second end of the memory cell to cause formation of the state

972

Detecting a variable associated with the formation of the state in the memory cell

974

Limiting the potential difference between the first end and the second end of the memory cell upon detection that the variable has a predetermined value

976

CIRCUIT ARRANGEMENT AND A METHOD OF WRITING STATES TO A MEMORY CELL

CROSS-REFERENCE TO RELATED APPLICATION

This application claims the benefit of priority of U.S. provisional application No. 61/567,157 filed Dec. 6, 2011, the contents of it being hereby incorporated by reference in its entirety for all purposes.

TECHNICAL FIELD

Various aspects of this disclosure relate to circuit arrangements for writing states to memory cells.

BACKGROUND

Resistive random access memory (REAM) is a new non-volatile memory type whose basic idea is that a dielectric, which is normally insulating, can be made to conduct through a filament or conduction path formed after application of a sufficiently high voltage. The conduction path formation can arise from different mechanisms including, for example defects, metal migration. Once the filament is formed, it may be reset by being broken, which may result in high resistance or set by being re-formed, which may result in lower resistance, by an appropriately applied voltage.

FIG. 1 shows an illustration of a conventional resistive random access memory (RRAM) array 100. The RRAM cells are organized into RRAM blocks 102. Electrical connections 104 include bit lines in electrical connection to the RRAM blocks 102 for activating a particular cell in a block 102 as well as lines associated with voltage regulation and sensing. Electrical connections 106 include word lines in electrical connection to the RRAM blocks 102 for activating a particular cell in a block 102 as well as control lines and lines to provide reference voltages.

The switch from the high resistance state to the low resistance state requires the application of a potential difference to the memory cell. The switch from the low resistance state to the high resistance requires the application of another potential difference in the opposing direction to the memory cell.

FIG. 2 is a graph illustrating the current—voltage characteristics of a conventional resistive random access memory (RRAM) memory cell during set and reset. Line 202 indicates a high resistance state. At this state, the conductive filaments are broken. Upon application of a suitable positive switching voltage, conductive filaments are formed and current increases greatly with voltage in line 204. Line 206 indicates a low resistance state in which conductive filaments are present in the memory cell. Upon application of a suitable negative switching voltage, the filaments are broken and current decreases with voltage in line 208. The memory cell is then again at the low resistance state indicated by line 202.

One electrode may be pulled to ground and another electrode may be connected to a multiplexer to select with a positive voltage and a negative voltage. However, this requires a negative voltage which is not compatible with standard complementary metal oxide semiconductor (CMOS) processes.

Alternatively, one electrode may be pulled to a voltage of half a positive power supply voltage (VDD/2) and the other electrode may be connected to a multiplexer to switch between a high voltage more than VDD/2 or a low voltage less than VDD/2. However, this method requires a much higher (usually more than double) power supply voltage.

SUMMARY

Various aspects of this disclosure provide an improved circuit arrangement that is able to address at least partially the abovementioned challenges.

In various embodiments, a circuit arrangement for writing a first state or a second state to a memory cell including a memory cell having a first end and a second end, a first electrode in electrical connection with the first end of the memory cell, a second electrode in electrical connection with the second end of the memory cell, a first switch in electrical connection with the first electrode, the first switch configured to switch between a first voltage and a second voltage and a second switch in electrical connection with the second electrode, the second switch configured to switch between a third voltage and a fourth voltage, wherein on writing the first state to the memory cell the circuit arrangement is configured such that the first switch electrically connects to the first voltage and the second switch electrically connects to the fourth voltage to apply a first potential difference between the first and second ends of the memory cell, the first potential difference causing formation of the first state in the memory cell, and wherein on writing the second state to the memory cell the circuit arrangement is configured such that the first switch electrically connects to the second voltage and the second switch electrically connects to the third voltage to apply a second potential difference between the first and second ends of the memory cell, the second potential difference causing formation of the second state in the memory cell.

In various embodiments, a method of writing a first state or a second state to a memory cell wherein writing the first state to the memory cell includes electrically connecting a first switch, the first switch in electrical connection to a first end of the memory cell, to a first voltage and electrically connecting a second switch, the second switch in electrical connection to a second end of the memory cell, to a fourth voltage to apply a first potential difference between a first and a second end of the memory cell, the first potential difference causing formation of the first state in the memory cell, wherein writing the second state to the memory cell includes electrically connecting the first switch to the second voltage and electrically connecting the second switch to the third voltage to apply a second potential difference between the first and second ends of the memory cell, the second potential difference causing formation of the second state in the memory cell, and wherein only one state is written to the memory cell at any time In various embodiments, a circuit arrangement for writing a state to a memory cell including a memory cell having a first end and a second end, a switching arrangement in electrical connection with the memory cell, the switching arrangement configured to electrically connect the memory cell to a voltage source during writing the state to generate a potential difference between the first end and the second end of the memory cell, the potential difference causing formation of the state in the memory cell; and a detection circuit configured to detect a variable associated with the formation of the state in the memory cell, and a feedback circuit arrangement in electrical connection between the detection circuit and the switching arrangement, the feedback circuit configured to trigger the switching arrangement to limit the potential difference between the first end and the second end of the memory cell upon detection by the detection circuit that the variable has a predetermined value.

In various embodiments, a method for writing a state to a memory cell including providing a potential difference across a first end and a second end of the memory cell to cause formation of the state, detecting a variable associated with the formation of the state in the memory cell, and limiting the potential difference between the first end and the second end of the memory cell upon detection that the variable has a predetermined value.

BRIEF DESCRIPTION OF THE DRAWINGS

The invention will be better understood with reference to the detailed description when considered in conjunction with the non-limiting examples and the accompanying drawings, in which:

FIG. 9B shows a method for writing a state to a memory cell according to various embodiments.

DETAILED DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, and logical changes may be made without departing from the scope of the invention. The various embodiments are not necessarily mutually exclusive, as some embodiments can be combined with one or more other embodiments to form new embodiments.

In order that the invention may be readily understood and put into practical effect, particular embodiments will now be described by way of examples and not limitations, and with reference to the figures.

Figure 1:
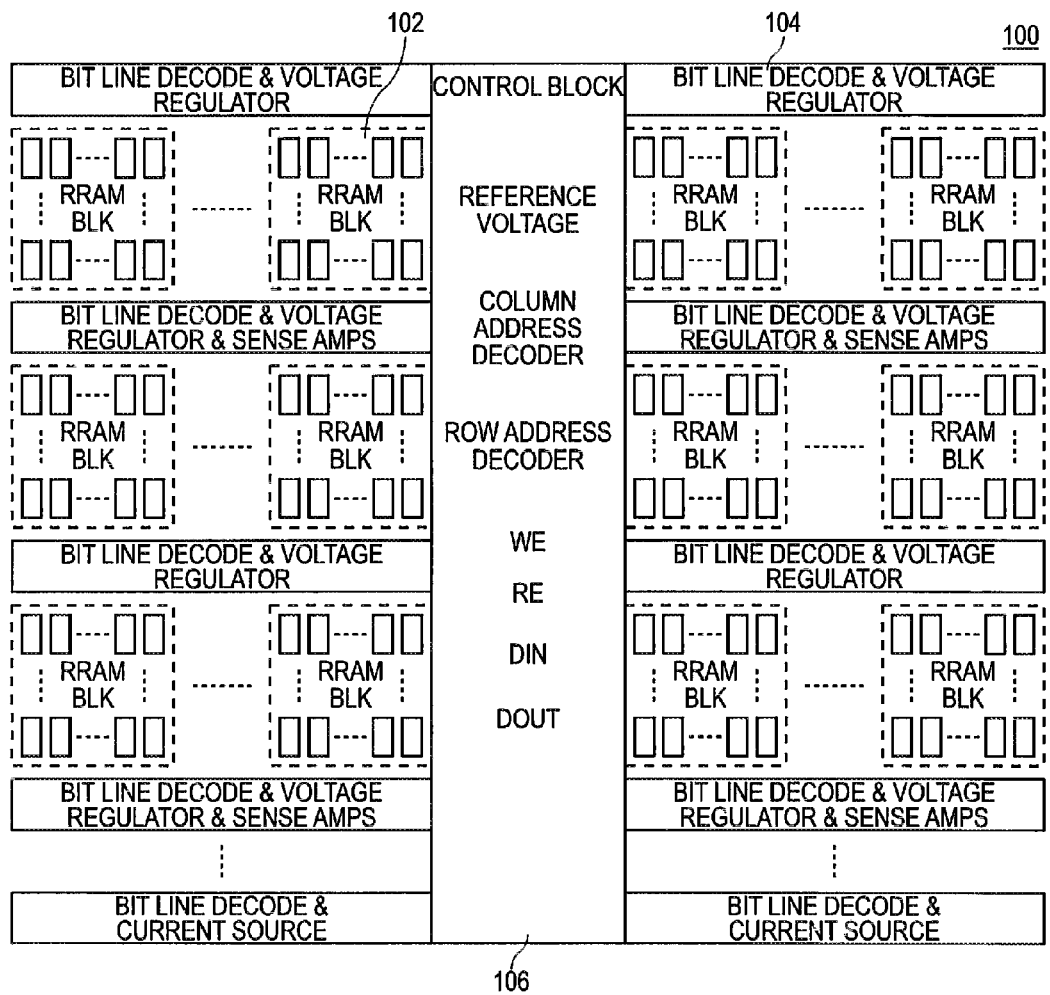
FIG. 1 shows an illustration of a conventional resistive random access memory (RRAM) array.
Figure 2:
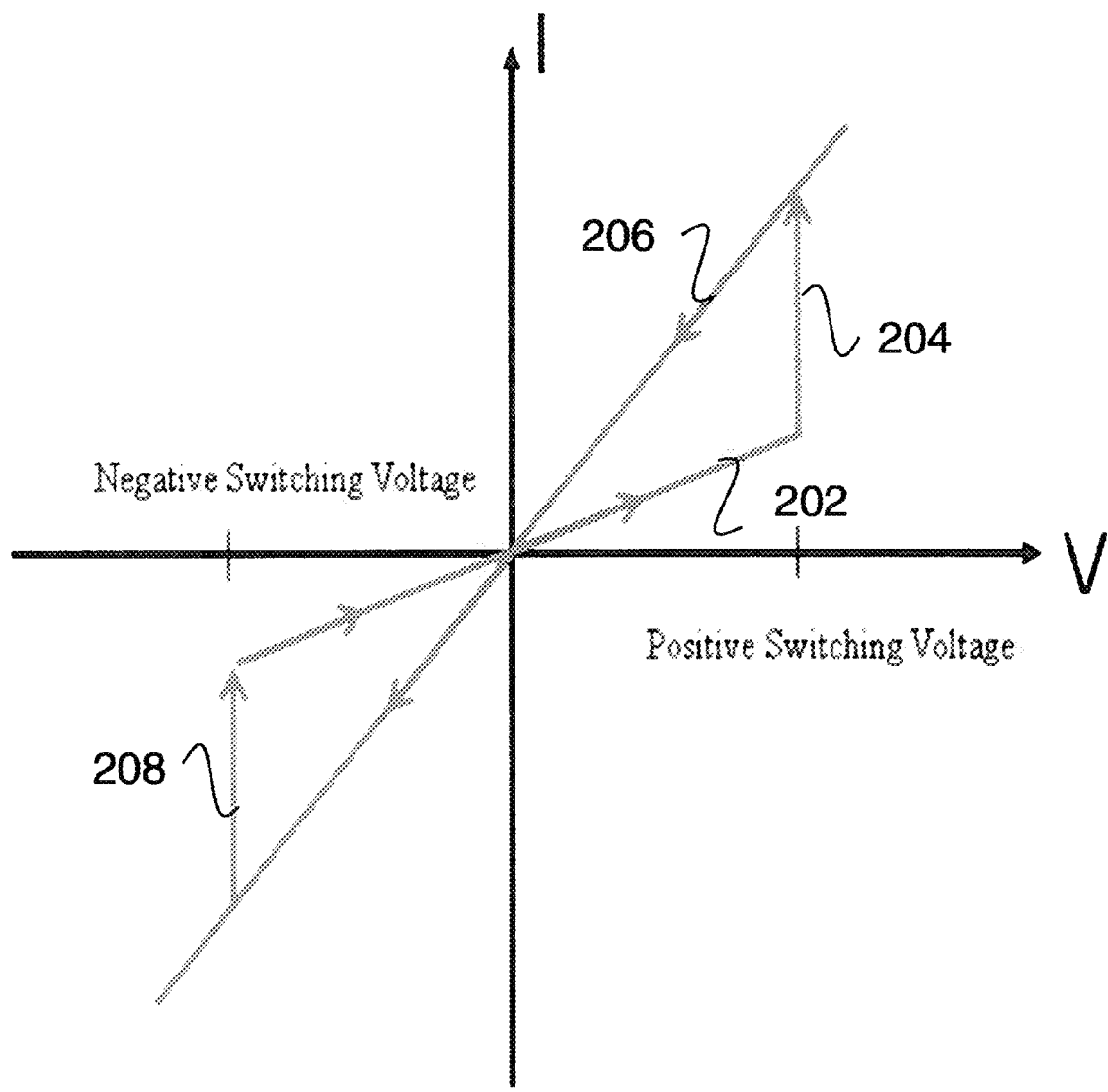
FIG. 2 is a graph illustrating the current—voltage characteristics of a conventional resistive random access memory (RRAM) memory cell during set and reset.
Figure 3A:
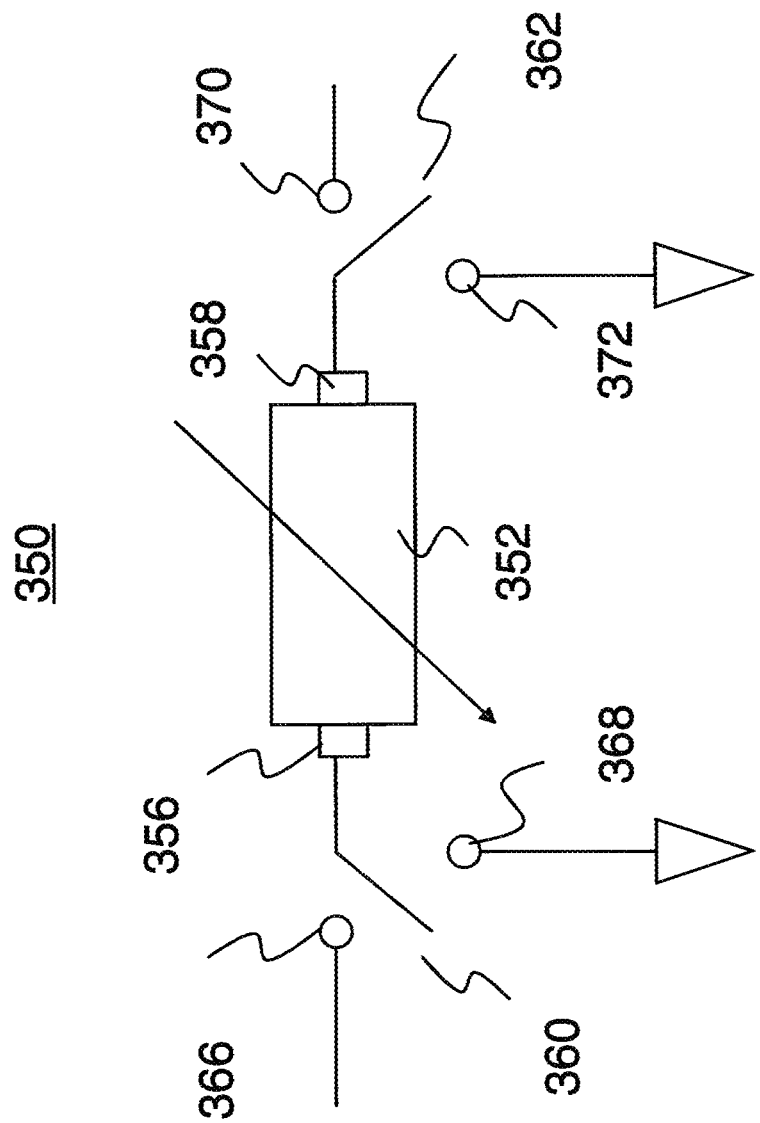
FIG. 3A shows an illustration of a circuit arrangement according to various embodiments.

FIG. 3A shows an illustration of a circuit arrangement according to various embodiments. In various embodiments, a circuit arrangement 350 for writing a first state or a second state to a memory cell 352 including a memory cell 352 having a first end and a second end. There is a first electrode 356 in electrical connection with the first end of the memory cell. There is a second electrode 358 in electrical connection with the second end of the memory cell 352. There is also a first switch 360 in electrical connection with the first electrode 356, the first switch 360 configured to switch between a first voltage 366 and a second voltage 368. There is also a second switch 362 in electrical connection with the second electrode 358, the second switch 362 configured to switch between a third voltage 370 and a fourth voltage 372. On writing the first state to the memory cell 352 the circuit arrangement 350 is configured such that the first switch 360 electrically connects to the first voltage 366 and the second switch 362 electrically connects to the fourth voltage 372 to apply a first potential difference between the first and second ends of the memory cell 352, the first potential difference causing formation of the first state in the memory cell 352. On writing the second state to the memory cell 352 the circuit arrangement 350 is configured such that the first switch 360 electrically connects to the second voltage 368 and the second switch 362 electrically connects to the third voltage 370 to apply a second potential difference between the first and second ends of the memory cell 352, the second potential difference causing formation of the second state in the memory cell 352.

In other words, a circuit arrangement including a first and a second sub-circuit arrangement is provided. A first power source is in electrical connection to the first sub-circuit arrangement and a second power source is in electrical connection to the second sub-circuit arrangement. There is also a first electrode in electrical connection with the first end of a memory cell, a second electrode in electrical connection with the second end of the memory cell. A first switch is in electrical connection with the first electrode and a second switch is in electrical connection with the second electrode. The circuit arrangement is configured such that when writing a first state to the memory cell, the first and second switches electrically connect the memory cell to the first sub-circuit arrangement such that a current flows through the memory cell from the first power source via the first sub-circuit arrangement. The first and second switches are not electrically connected to second sub-circuit arrangement. When writing a second state to the memory cell, the first and second switches electrically connect the memory cell to the second sub-circuit arrangement such that a current flows through the memory cell from the second power source via the second sub-circuit arrangement.

In this manner, an improved circuit arrangement that is able to address at least partially some of the abovementioned challenges is provided.

In various embodiments, on writing the first state to the memory cell 352, a first current is generated to flow in a first direction between the first electrode 356 and the second electrode 358 and on writing the second state to the memory cell 352, a second current is generated to flow in a second direction opposite the first direction between the first electrode 356 and the second electrode 358.

In various embodiments, the first potential difference is different from the second potential difference. In various embodiments, the first voltage 366 is of a positive polarity. In various embodiments, the third voltage 370 is of a positive polarity. In various embodiments, the second voltage 368 is about 0V. In various embodiments, the fourth voltage is about 0V. In various embodiments, the memory cell 352 is a resistive random access memory cell.

In various embodiments, the circuit arrangement 350 further includes a voltage regulating circuit arrangement in electrical connection with the first switch configured to generate the first voltage 366 (not shown in FIG. 3A). In various embodiments, the voltage regulating circuit arrangement includes a transistor having a controlling terminal, a first controlled terminal and a second controlled terminal, the second controlled terminal in electrical connection to the first switch, the first controlled terminal configured to be electrically connected to an unregulated voltage source. In various embodiments, the voltage regulating circuit arrangement includes a differential operational amplifier having an output terminal, a first input terminal and a second input terminal, the output terminal in electrical connection to the controlling terminal of the transistor and the first input terminal is configured to be electrically connected to a reference voltage source. In various embodiments, the voltage regulating circuit arrangement includes a first resistor having a first end and a second end, the first end of the first resistor in electrical connection to the second controlled terminal of the transistor and the second end of the first resistor in electrical connection to the second input terminal of the amplifier. In various embodiments, the voltage regulating circuit arrangement includes a second resistor having a first end and a second end, the first end of the second resistor in electrical connection to the second end of the first resistor and the second end of the second resistor configured to be connected to ground. In various embodiments, the voltage regulating circuit arrangement includes a capacitor having a first end and a second end, the first end of the capacitor in electrical connection to the first end of the first resistor and the second end of the capacitor configured to be connected to ground. In various embodiments, the voltage regulating circuit arrangement is configured such that the transistor is triggered by the differential operational amplifier to limit the first voltage generated at the second controlled terminal when the difference between the first voltage and the reference voltage source exceeds a predetermined value.

In various embodiments, the circuit arrangement 350 further includes a voltage regulating circuit arrangement in electrical connection with the second switch configured to generate the third voltage 370 (not shown in FIG. 3A). In various embodiments, the voltage regulating circuit arrangement includes a transistor having a controlling terminal, a first controlled terminal and a second controlled terminal, the second controlled terminal in electrical connection to the second switch, the first controlled terminal configured to be electrically connected to an unregulated voltage source. In various embodiments, the voltage regulating circuit arrangement includes a differential operational amplifier having an output terminal, a first input terminal and a second input terminal, the output terminal in electrical connection to the controlling terminal of the transistor and the first input terminal is configured to be electrically connected to a reference voltage source. In various embodiments, the voltage regulating circuit arrangement includes a first resistor having a first end and a second end, the first end of the first resistor in electrical connection to the second controlled terminal of the transistor and the second end of the first resistor in electrical connection to the second input terminal of the amplifier. In various embodiments, the voltage regulating circuit arrangement includes a second resistor having a first end and a second end, the first end of the second resistor in electrical connection to the second end of the first resistor and the second end of the second resistor configured to be connected to ground. In various embodiments, the voltage regulating circuit arrangement includes a capacitor having a first end and a second end, the first end of the capacitor in electrical connection to the first end of the first resistor and the second end of the capacitor configured to be connected to ground. In various embodiments, the voltage regulating circuit arrangement is configured such that the transistor is triggered by the differential operational amplifier to limit the third voltage generated at the second controlled terminal when the difference between the third voltage and the reference voltage source exceeds a predetermined value.

Figure 3B:
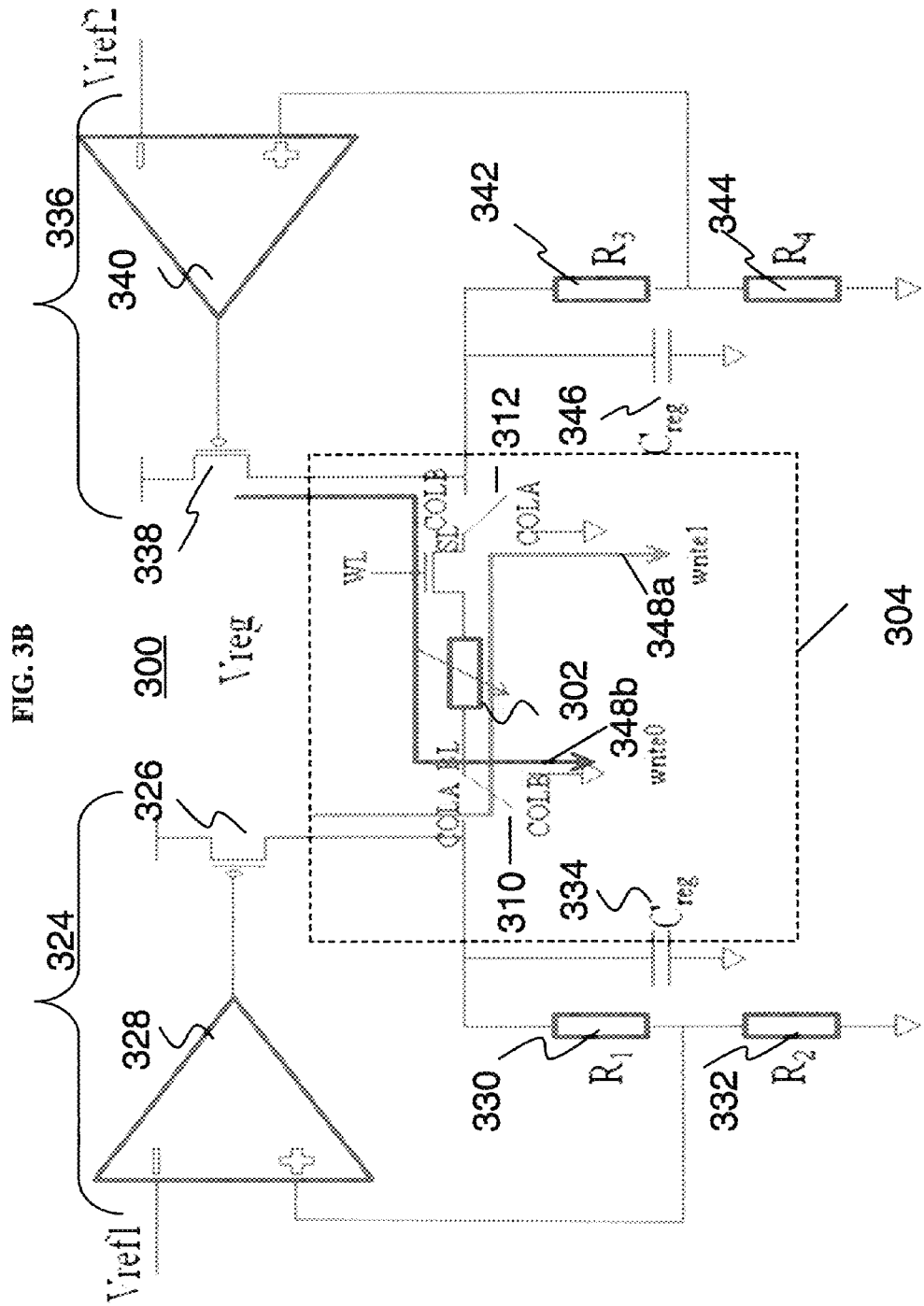
FIG. 3B shows an illustration of a circuit arrangement configured for writing a first state or a second state to a memory cell according to various embodiments.
Figure 4A:
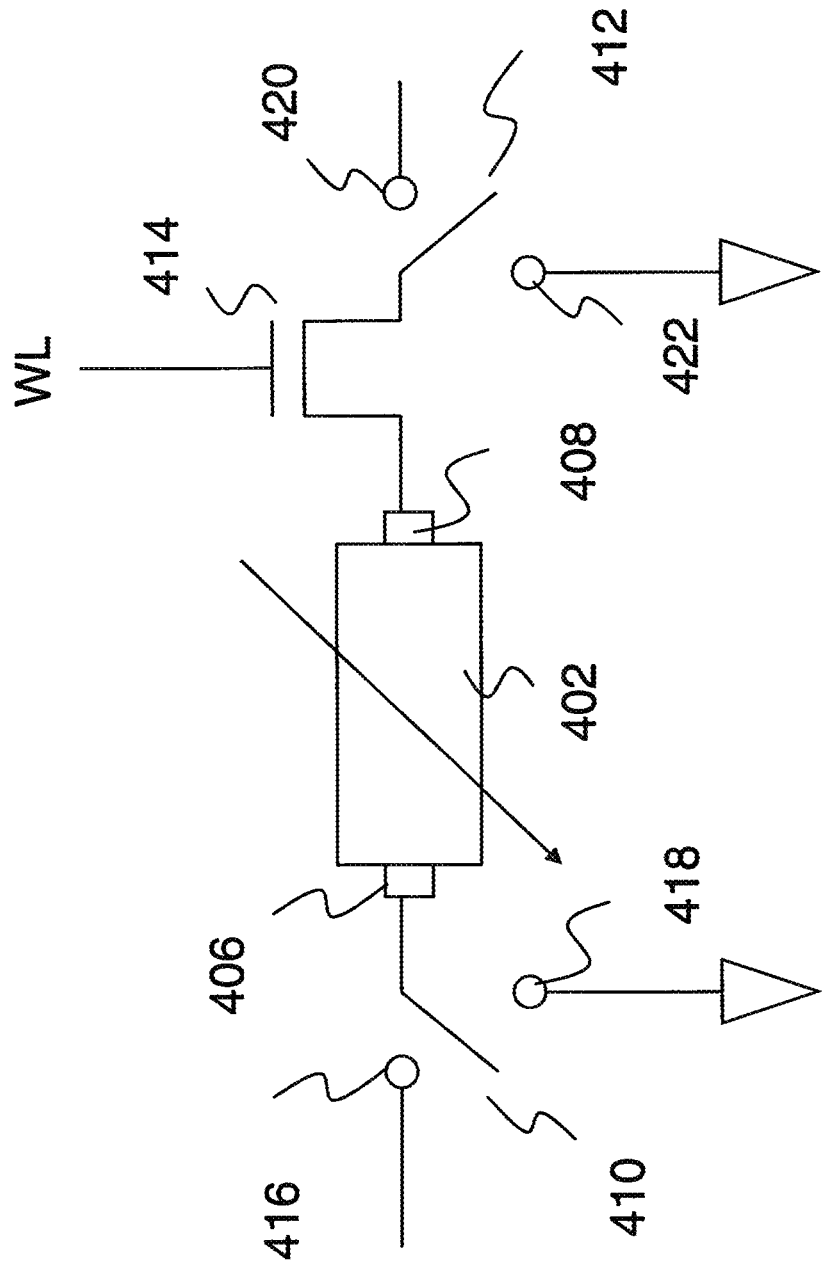
FIG. 4A shows an illustration of a magnified view of area in FIG. 3B according to various embodiments.

FIG. 3B shows an illustration of a circuit arrangement 300 configured for writing a first state or a second state to a memory cell 302 according to various embodiments. FIG. 4A shows an illustration of a magnified view of area 304 in FIG. 3B in accordance to various embodiments. The memory cell 402 corresponds to the memory cell 302. Electrodes 406 and 408 are in electrical connection to a first end and a second end respectively of the memory cell 402, 302 (Electrodes not illustrated in FIG. 3B). The electrodes 406, 408 may be integrally formed with the memory cell 402, 302 or may be separately formed. The electrodes 406, 408 may include any suitable electrically conductive material. A first switch 410, 310 is in electrical connection with the first electrode 406. A second switch 412, 312 is in electrical connection with the second electrode 408.

A transistor 414 such as a field effect transistor may be present between the second electrode 408 and the second switch 412, 312 as shown in FIGS. 3 and 4. In other words, the second switch 412, 312 may be in electrical connection with the second electrode 408 via the transistor 414. Alternatively, the transistor 414 may be present between the first electrode 406 and the first switch 410, 310. In other words, the first switch 410, 310 may be in electrical connection with the first electrode 406 via the transistor 414. The transistor 414 is configured to select the particular memory cell 302, 402 for operation and is triggered by application of a voltage at the gate of the transistor using a word line (WL). When the transistor 414 is in the ON state, it allows current to flow through. Conversely, when the transistor 414 is in the OFF state, it does not allow current to flow through. The transistor 414 is in the ON state during writing of a state to memory cell 302, 402.

It will be understood that a first element is in electrical connection to a second element via a switch or transistor means that when the switch or the transistor is switched on or is in the ON state, a current flows between the first and second elements through the switch or transistor upon application of a potential difference between the first and second elements. However, then the switch or the transistor is switched off or is in the OFF state, no current flows even upon the application of a potential difference between the first and second elements. Also, no current flows when the switch or the transistor is switched on or is in the ON state but there is no potential difference between the first and second elements.

A first voltage may be applied at node 416 and a second voltage may be applied at node 418. The first switch 410 is configured to switch between a first voltage at node 416 and a second voltage at node 418. A third voltage may be applied at node 420 and a fourth voltage may be applied at node 422. The second switch 412 is configured to switch between a third voltage at node 420 and a fourth voltage at node 422.

On writing the first state to the memory cell the circuit arrangement 300 is configured such that the first switch 410 electrically connects to the first voltage and the second switch 412 electrically connects to the fourth voltage to apply a first potential difference between the first and second ends of the memory cell 302, 402, the first potential difference causing formation of the first state in the memory cell 302, 402. The writing of the first state to the memory cell is indicated by 348a.

On writing the second state to the memory cell the circuit arrangement 300 is configured such that the first switch 410 electrically connects to the second voltage and the second switch 412 electrically connects to the third voltage to apply a second potential difference between the first and second ends of the memory cell 302, 402, the second potential difference causing formation of the second state in the memory cell 302, 402. The writing of the first state to the memory cell is indicated by 348b.

Figure 4B:
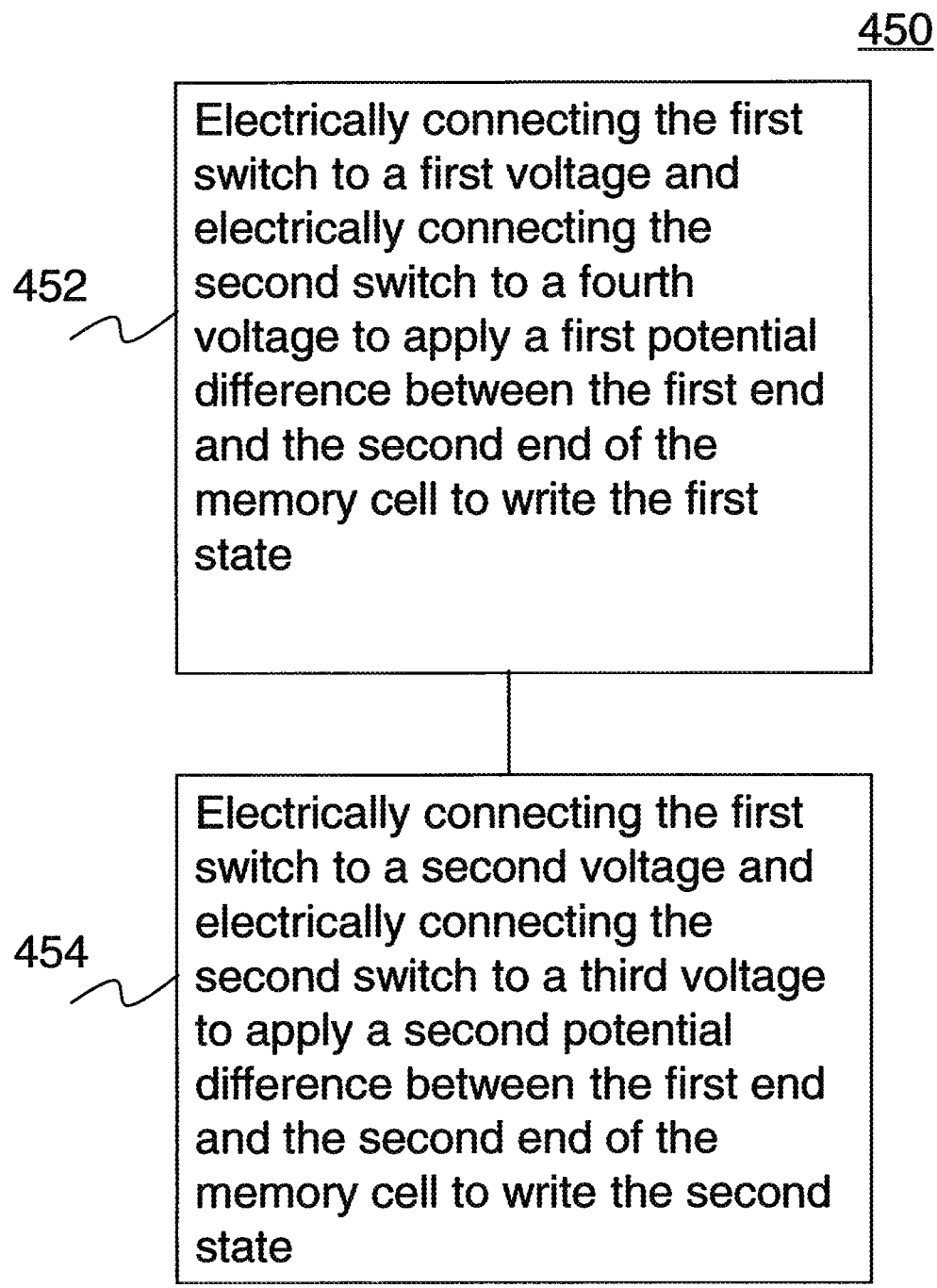
FIG. 4B shows an illustration of a method of writing a first state or a second state to a memory cell according to various embodiments.

FIG. 4B shows an illustration of a method 450 of writing a first state or a second state to a memory cell according to various embodiments. In various embodiments, a method 450 of writing a first state or a second state to a memory cell wherein writing the first state to the memory cell 452 includes electrically connecting a first switch, the first switch in electrical connection to a first end of the memory cell, to a first voltage and electrically connecting a second switch, the second switch in electrical connection to a second end of the memory cell, to a fourth voltage to apply a first potential difference between a first and a second end of the memory cell, the first potential difference causing formation of the first state in the memory cell; wherein writing the second state to the memory cell 454 includes electrically connecting the first switch to the second voltage and electrically connecting the second switch to the third voltage to apply a second potential difference between the first and second ends of the memory, cell, the second potential difference causing formation of the second state in the memory cell; and wherein only one state is written to the memory cell at any time. It will be understood that there is no particular order in which the states are written to the memory cell 454. A first state can be written followed by a second state. Alternatively, a second state can be written followed by the first state. Also, a first state can be written after another first state is written or a second state can be written after another second state is written.

The circuit arrangement may further include a switching circuit arrangement such as a logic circuit which controls the first and second switches such that the first switch 410 electrically connects to the first voltage and the second switch 412 electrically connects to the fourth voltage in a first instance and the first switch 410 electrically connects to the second voltage and the second switch 412 electrically connects to the third voltage to apply a second potential difference in a second instance.

In various embodiments, the first state is the SET state. In various embodiments, the second state is the RESET state.

In various embodiments, the memory cell is a resistive random access memory cell (RRAM). In various embodiments, the first state or SET state is a low resistance state and the second state or RESET state is the high resistance state. In various embodiments, the first state of the memory cell represents a first logic state and the second state of the memory cell represents a second logic state.

In various embodiments, the memory cell is a phase change random access memory cell (PCRAM). In various embodiments, the memory cell is a spin-transfer torque magnetic random access memory (STT_MRAM).

In various embodiments, on writing the first state to the memory cell 402, 302, a first current is generated to flow in a first direction between the first electrode 406 and the second electrode 408 and on writing the second state to the memory cell, a second current is generated to flow in a second direction opposite the first direction between the first electrode 406 and the second electrode 408.

In various embodiments, the first potential difference is different from the second potential difference. In other words, the SET voltage and the RESET voltage may be different. The pulse widths of the SET and RESET pulse are also different. This may maximize writing speeds.

In various embodiments, the first power source provides a different voltage from the second power source.

In various embodiments, the first voltage is of a positive polarity. In various embodiments, the third voltage is of a positive polarity. In various embodiments, the second voltage is about 0V. In various embodiments, the fourth voltage is about 0V.

In various embodiments, the first switch includes a multiplexer or a single pole double throw (SPDT) switch. In various embodiments, the second switch includes a multiplexer or a single pole double throw (SPDT) switch. In various embodiments, the first and second switches include transistors or electronic switches. The use of electronic switches or transistors may help reduce parasitic currents flowing through non-selected memory cells. In various embodiments, the first switch may refer to a group of electronic components such as transistors or electronic switches which cooperate together in such a manner to perform the function of a multiplexer and a single pole double throw (SPDT) switch. In various embodiments, the second switch may refer to a group of electronic components such as transistors or electronic switches which cooperate together in such a manner to perform the function of a multiplexer and a single pole double throw (SPDT) switch.

In various embodiments, the circuit arrangement further includes a voltage regulating circuit arrangement 324 in electrical connection with the first switch 310 configured to generate the first voltage. The voltage regulating circuit arrangement 324 may include a transistor 326 having a controlling terminal, a first controlled terminal and a second controlled terminal, the second controlled terminal in electrical connection to the first switch, the first controlled terminal configured to be electrically connected to an unregulated voltage source. The voltage regulating circuit arrangement 324 may further include an differential operational amplifier 328 having an output terminal, a first input terminal and a second input terminal, the output terminal in electrical connection to the controlling terminal of the transistor 326 and the first input terminal is configured to be electrically connected to a reference voltage source ($V_{ref1}$). The voltage regulating circuit arrangement 324 may further include a first resistor 330 having a first end and a second end, the first end of the first resistor 330 in electrical connection to the second controlled terminal of the transistor 326 and the second end of the first resistor 330 in electrical connection to the second input terminal of the amplifier 328. The voltage regulating circuit arrangement 324 may further a second resistor 332 having a first end and a second end, the first end of the second resistor 332 in electrical connection to the second end of the first resistor 330 and the second end of the second resistor 332 configured to be connected to ground The voltage regulating circuit arrangement 324 may further include a capacitor 334 having a first end and a second end, the first end of the capacitor 334 in electrical connection to the first end of the first resistor 330 and the second end of the capacitor 334 configured to be connected to ground. The voltage regulating circuit arrangement 324 is configured such that the transistor 326 is triggered by the differential operational amplifier 328 to limit the first voltage generated at the second controlled terminal when the difference between the first voltage and the reference voltage source exceeds a predetermined value.

The predetermined value may refer to a threshold value. When the difference between the first voltage and the reference voltage exceeds the threshold value, the amplifier 328 senses this and triggers the transistor 326 into the OFF state. In this state, the current flowing through the transistor 326 is greatly reduced. The voltage drop across the transistor 326 becomes significant and the first voltage is reduced.

In various embodiments, the first voltage at the first switch or set voltage $V_{set}$ may be provided by the following equation:

$$V_{set} = V_{ref1} \times \frac{R_1 + R_2}{R_2}$$

$V_{ref1}$ is the voltage provided by the reference source of the voltage regulating circuit in electrical connection to the first switch, $R_1$ is the value of the first resistor of the voltage regulating circuit in electrical connection to the first switch, and $R_2$ is the value of the second resistor of the voltage regulating circuit in electrical connection to the first switch.

In various embodiments, the circuit arrangement further includes a voltage regulating circuit arrangement 336 in electrical connection with the second switch 312 configured to generate the third voltage. The voltage regulating circuit arrangement 336 includes may include a transistor 338 having a controlling terminal, a first controlled terminal and a second controlled terminal, the second controlled terminal in electrical connection to the second switch, the first controlled terminal configured to be electrically connected to an unregulated voltage source. The voltage regulating circuit arrangement 336 may further include an differential operational amplifier 340 having an output terminal, a first input terminal and a second input terminal, the output terminal in electrical connection to the controlling terminal of the transistor 338 and the first input terminal is configured to be electrically connected to a reference voltage source ($V_{ref2}$). The voltage regulating circuit arrangement 336 may further include a first resistor 342 having a first end and a second end, the first end of the first resistor 342 in electrical connection to the second controlled terminal of the transistor 338 and the second end of the first resistor 342 in electrical connection to the second input terminal of the amplifier 340. The voltage regulating circuit arrangement 336 includes may include a second resistor 344 having a first end and a second end, the first end of the second resistor 344 in electrical connection to the second end of the first resistor 342 and the second end of the second resistor 344 configured to be connected to ground. The voltage regulating circuit arrangement 336 includes may include a capacitor 346 having a first end and a second end, the first end of the capacitor 346 in electrical connection to the first end of the first resistor 342 and the second end of the capacitor 346 configured to be connected to ground. The voltage regulating circuit arrangement 336 is configured such that the transistor 338 is triggered by the differential operational amplifier 340 to limit the third voltage generated at the second controlled terminal when the difference between the third voltage and the reference voltage source exceeds a predetermined value.

The predetermined value may refer to a threshold value. When the difference between the third voltage and the reference voltage exceeds the threshold value, the amplifier 340 senses this and triggers the transistor 338 into the OFF state. In this state, the current flowing through the transistor 338 is greatly reduced. The voltage drop across the transistor 338 becomes significant and the third voltage is reduced.

In various embodiments, the first voltage at the first switch or set voltage $V_{reset}$ may be provided by the following equation:

$$V_{reset} = V_{ref2} \times \frac{R_3 + R_4}{R_4}$$

$V_{ref2}$ is the voltage provided by the reference source of the voltage regulating circuit in electrical connection to the second switch, $R_3$ is the value of the first resistor of the voltage regulating circuit in electrical connection to the second switch, and $R_4$ is the value of the second resistor of the voltage regulating circuit in electrical connection to the second switch.

Figure 5:
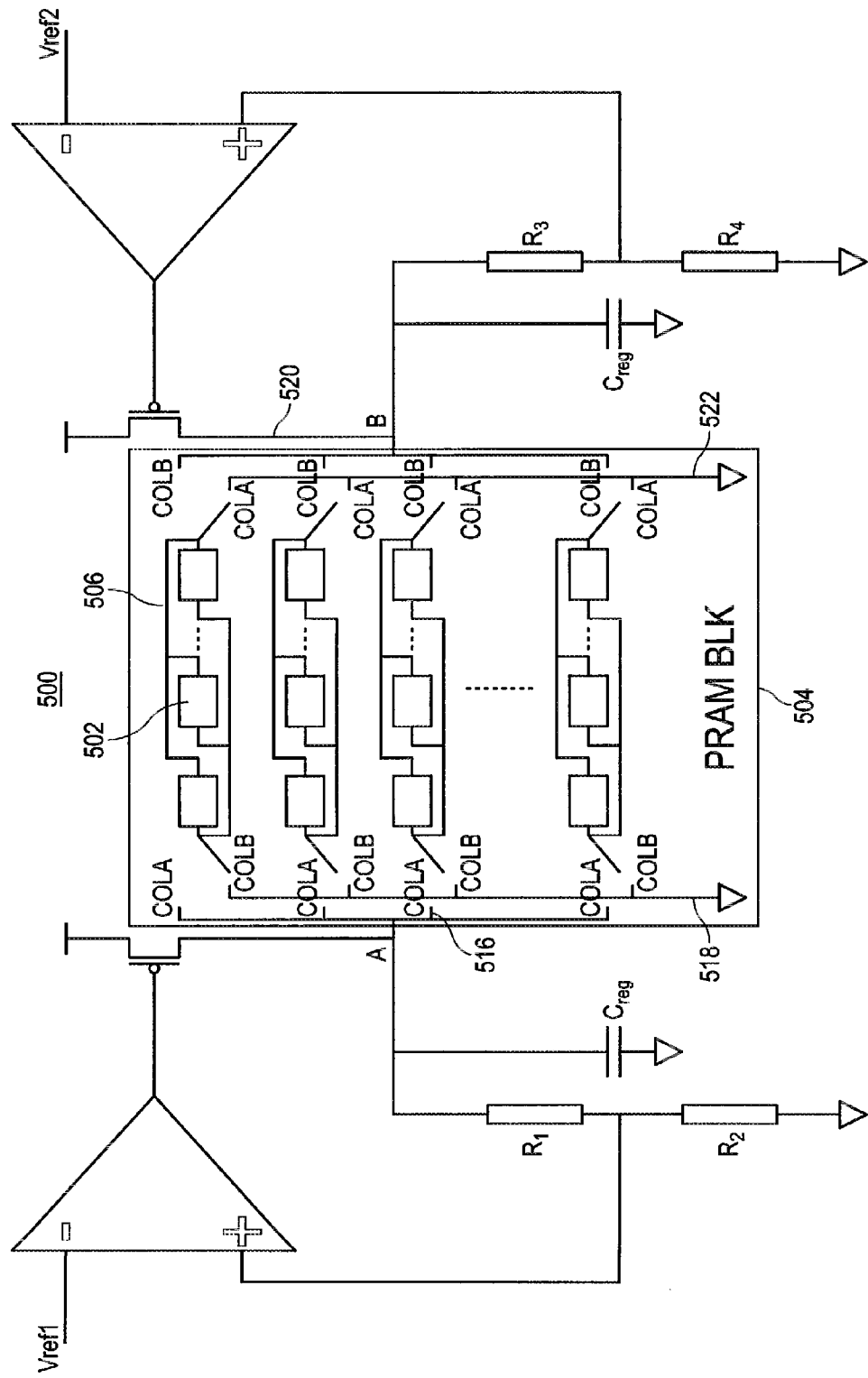
FIG. 5 shows a block level circuit arrangement illustration in accordance to various embodiments.

FIG. 5 shows an illustration of a block level circuit arrangement 500 in accordance to various embodiments for writing a first state or a second state to a memory cell 502 in a memory block 504. Block level circuit arrangement 500 includes further memory cells arranged in an row 506 with the memory cell 502, each of the further memory cell has a first end and a second end, the first ends of the further memory cells are in electrical connection with the first end of the memory cell, and the second ends of the further memory cells are in electrical connection with the second end of the memory cell. The first ends of the memory cells are in electrical connection with a first switch. The second ends of the memory cells are in electrical connection with a second switch. Each memory cell may have associated with it a transistor (not shown in FIG. 5). The first end of the memory cell may be in electrical connection to the first switch via the transistor. Alternatively, the second end of the memory cell may be in electrical connection in a second switch via the transistor.

It will be understood that a first element is in electrical connection to a second element via a switch or transistor means that when the switch or the transistor is switched on or is in the ON state, a current flows between the first and second elements through the switch or transistor upon application of a potential difference between the first and second elements. However, then the switch or the transistor is switched off or is in the OFF state, no current flows even upon the application of a potential difference between the first and second elements. Also, no current flows when the switch or the transistor is switched on or is in the ON state but there is no potential difference between the first and second elements.

The transistors are part of the addressing circuitry and help to select one or more cells from the row of memory cells for operation. The one or more cells may only be written if the associated one or more transistors are in the ON state.

Different rows of memory cells are arranged to form a block 504. Each row 506 has a first switch and a second switch positioned as described above. During a SET operation, the first switch of a selected row is connected to the first voltage 516 and the second switch of the selected row is connected to the fourth voltage 522. Writing of a state may be carried out for a memory cell 502 in the row 504 if the associated transistor for the memory cell 502 is in the ON state.

During a RESET operation, the first switch of a selected row is connected to the second voltage 518 and the second switch of the selected row is connected to the third voltage 520. Writing of a state will be carried out for a memory cell 502 in the row 504 if the associated transistor for the memory cell 502 is in the ON state.

In various embodiments, the second voltage 518 is about 0V. In various embodiments, the fourth voltage 522 is about 0V.

Figure 6:
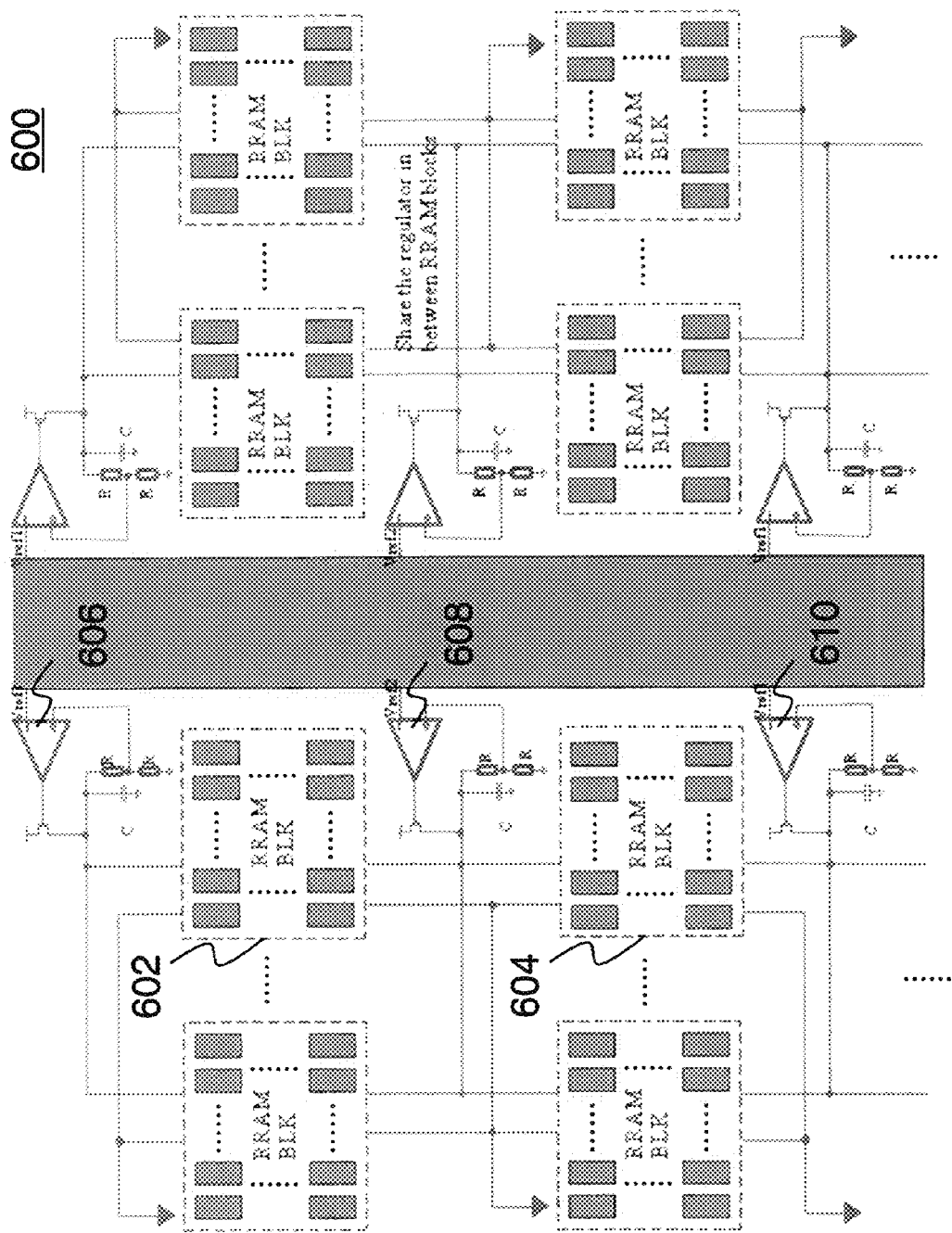
FIG. 6 shows an inter-block level circuit arrangement illustration in accordance to various embodiments.

FIG. 6 shows an inter-block circuit arrangement 600 according to various embodiments including a first block level circuit arrangement 602, a second block level circuit arrangement 604, a first voltage regulating circuit arrangement 606 to generate the first voltage for the first block level circuit arrangement 602, a second voltage regulating circuit arrangement 608 to generate the third voltage for the first and second block-level circuit arrangements 602, 604 and a third voltage regulating circuit arrangement 610 to generate the first voltage for the second block level circuit arrangement 604.

On writing the first state to a selected memory cell or cells of a selected row of the first block level circuit arrangement 602, the first block level circuit arrangement 602 is configured such that the first switch of the selected row electrically connects to the first voltage generated by the first voltage regulating circuit arrangement 606 and the second switch of the selected row electrically connects to the fourth voltage to apply a first potential difference between the first and second ends of the selected memory cell or cells in the selected row of the first block level circuit arrangement 602, the first potential difference causing formation of the first state in the selected memory cells of the first block level circuit arrangement 602.

On writing the second state to a selected memory cell or cells of a selected row of the memory block of the first block level circuit arrangement 602, the first block level circuit arrangement 602 is configured such that the first switch of the selected row electrically connects to the second voltage and the second switch of the selected row electrically connects to the third voltage generated by the second voltage regulating circuit arrangement 608 to apply a second potential difference between the first and second ends of the selected memory cell or cells in the selected row of the first block level circuit arrangement 602, the second potential difference causing formation of the second state in the selected memory cells of the first block level circuit arrangement 602.

On writing the first state to a selected memory cell or cells of a selected row of the second block level circuit arrangement 604, the second block level circuit arrangement 604 is configured such that the first switch of the selected row electrically connects to the first voltage generated by the third voltage regulating circuit arrangement 610 and the second switch of the selected row electrically connects to the fourth voltage to apply a first potential difference between the first and second ends of the selected memory cell or cells in the selected row of the second block level circuit arrangement 604, the first potential difference causing formation of the first state in the selected memory cells of the second block level circuit arrangement 604.

On writing the second state to a selected memory cell or cells of a selected row of the second block level circuit arrangement 604, the second block level circuit arrangement 604 is configured such that the first switch of the selected row electrically connects to the second voltage and the second switch of the selected row electrically connects to the third voltage generated by the second voltage regulating circuit arrangement 608 to apply a second potential difference between the first and second ends of the selected memory cell or cells in the selected row of the second block level circuit arrangement 604, the second potential difference causing formation of the second state in the memory block of the second block level circuit arrangement 604.

In various embodiments, the second voltage is about 0V. In various embodiments, the fourth voltage is about 0V.

Figure 7:
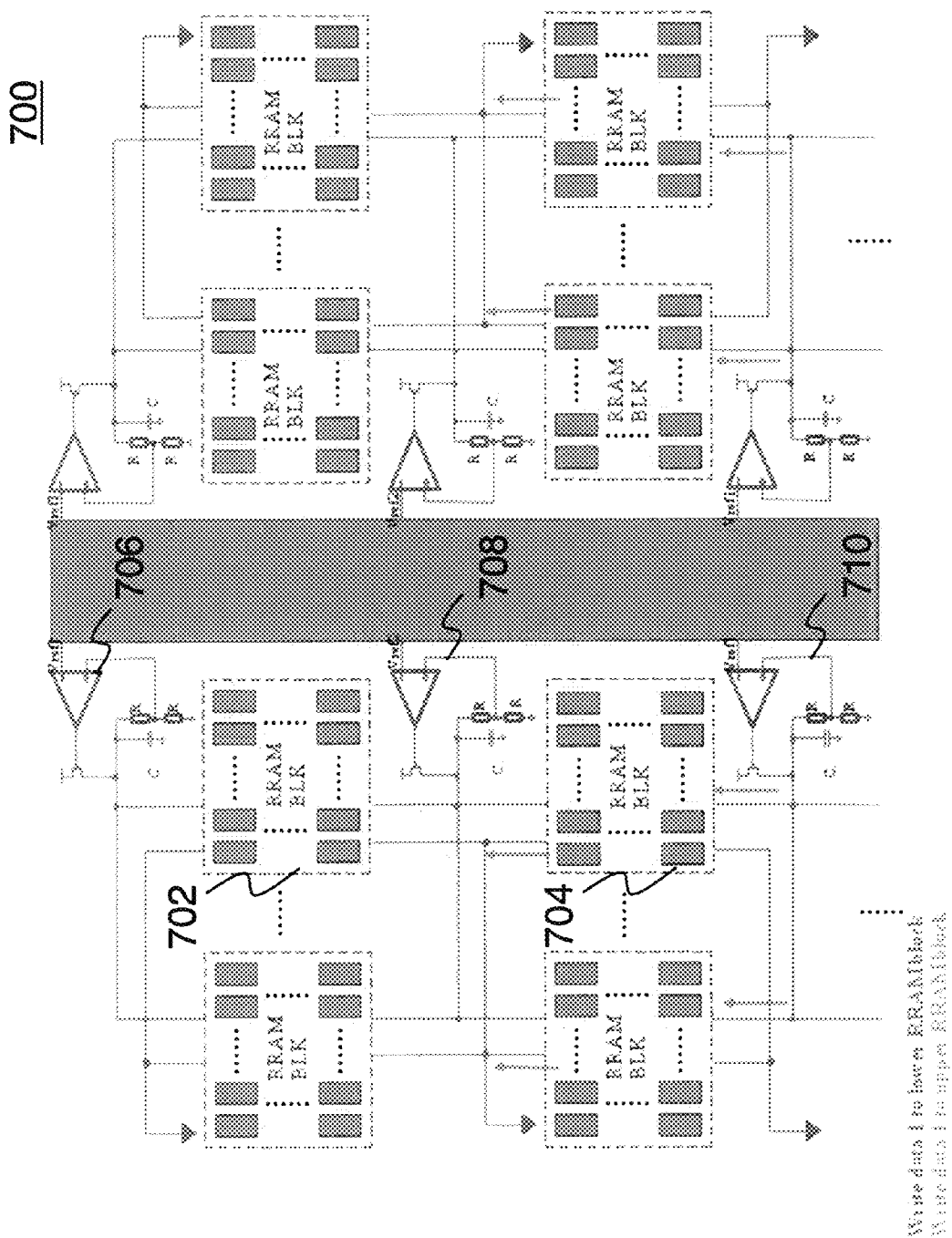
FIG. 7 shows the inter-block circuit arrangement in FIG. 6 according to various embodiments in which a first state is being written to a memory cell or cells in memory block and a first state in being written to a memory cell or cells in memory block.

FIG. 7 shows the inter-block circuit arrangement 700 in FIG. 6 according to various embodiments in which a first state is being written to a memory cell or cells in memory block 702 and a first state in being written to a memory cell or cells in memory block 704. The first voltage for memory block 702 is provided by the first block level circuit arrangement 706. The first voltage for memory block 704 is provided by the third block level circuit arrangement 710. The fourth voltage for both memory blocks 702, 704 is set to 0V.

Figure 8:
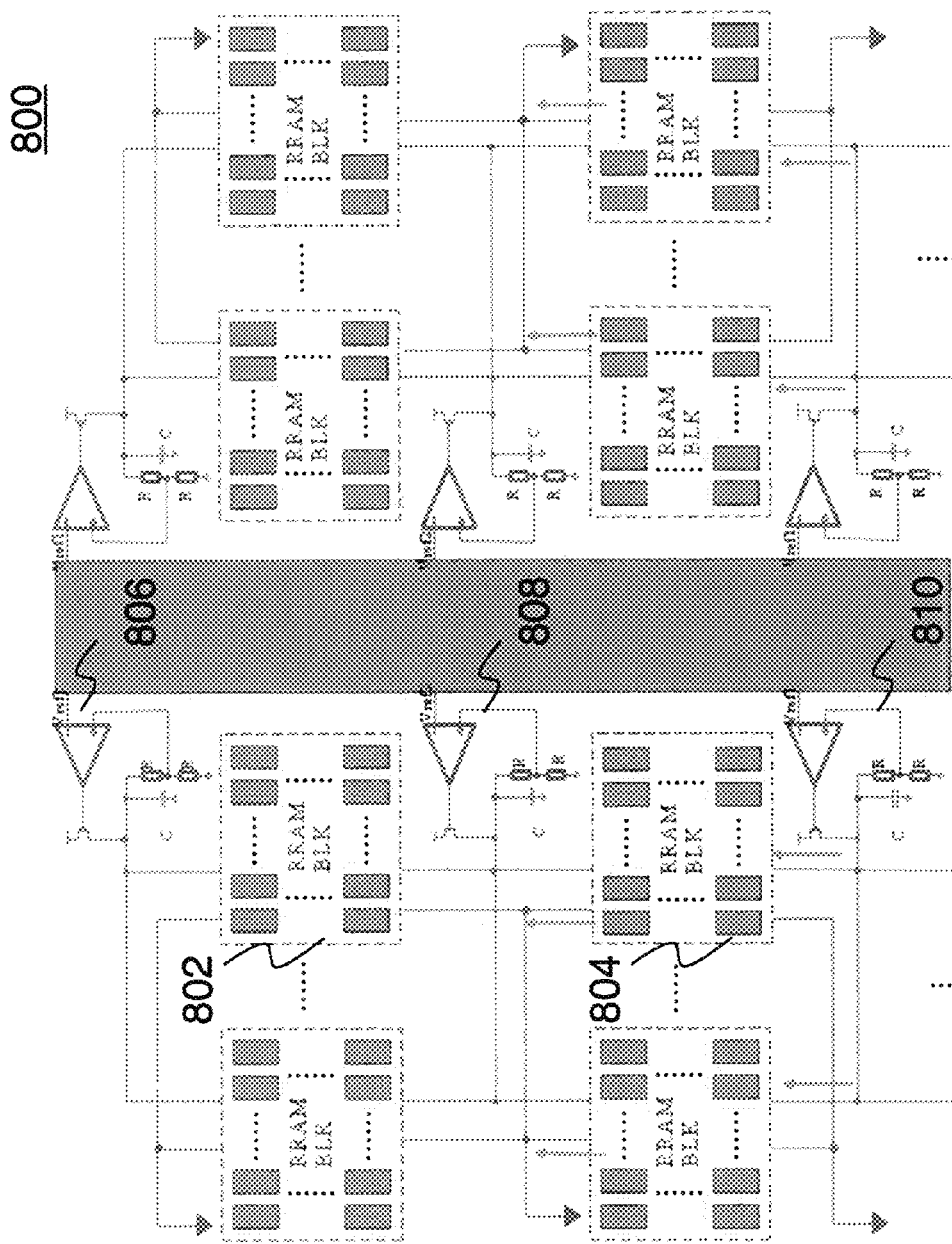
FIG. 8 shows the inter-block circuit arrangement in FIG. 6 according to various embodiments in which a second state is being written to a memory cell or cells in memory block and a second state in being written to a memory cell or cells in memory block.

FIG. 8 shows the inter-block circuit arrangement 800 in FIG. 6 according to various embodiments in which a second state is being written to a memory cell or cells in memory block 702 and a second state in being written to a memory cell or cells in memory block 704. The third voltage for memory block 702 and the third voltage for memory block 704 are provided by the second block level circuit arrangement 708. The second voltages for both memory blocks 702, 704 are set to 0V.

By sharing the second voltage regulating circuit arrangement between the first and second memory blocks, area dedicated for voltage regulating circuitry will be saved.

For the same array size, having a greater number of memory blocks will shorten the bit lines and increase the writing speed. The number of memory blocks may be determined by balancing performance with costs.

Resistive random-access memory (RRAM) has a high resistance state and a low resistance state. The resistance of RRAM cell will be changed from a low level to a high level during "reset", which means the current goes through RRAM cell will get smaller if the writing voltage is still the same. On the contrary, changing to SET state will change the resistance of RRAM from a high level to a low level. The resistance of the memory cell at the low resistance state may be less than 10% of the resistance of the memory cell at the high resistance state. If the SET voltage is still the same, the SET state current will be increased by more than 10 times, which will increase the power consumption of the circuit and reduce the lifetime of RRAM cell. Moreover, it may even change the material of RRAM cell and make it have an abnormal working condition.

Figure 9A:
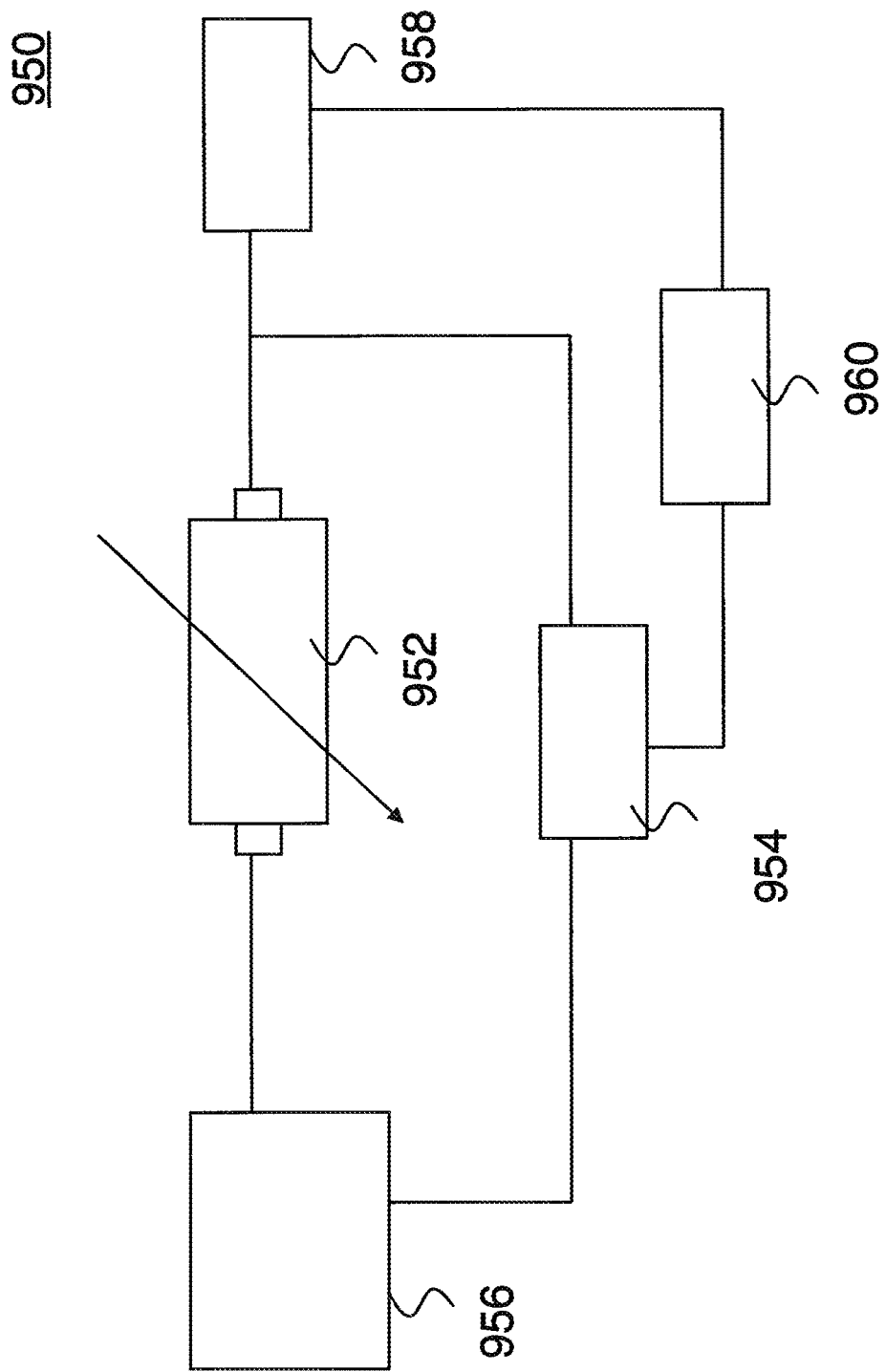
FIG. 9A shows an illustration of a circuit arrangement for writing a state to a memory cell according to various embodiments.

FIG. 9A shows an illustration of a circuit arrangement 950 for writing a state to a memory cell 952 according to various embodiments. In various embodiments, a circuit arrangement 950 for writing a state to a memory cell 952 including a memory cell 952 having a first end and a second end. The circuit arrangement 950 further includes a switching arrangement 954 in electrical connection with the memory cell 952, the switching arrangement 954 configured to electrically connect the memory cell 952 to a voltage source 956 during writing the state to generate a potential difference between the first end and the second end of the memory cell, the potential difference causing formation of the state in the memory cell 952. The circuit arrangement 950 further includes a detection circuit 958 configured to detect a variable associated with the formation of the state in the memory cell 952 and a feedback circuit arrangement 960 in electrical connection between the detection circuit 958 and the switching arrangement 954, the feedback circuit 960 configured to trigger the switching arrangement 954 to limit the potential difference between the first end and the second end of the memory cell 952 upon detection by the detection circuit 958 that the variable has a predetermined value.

Advantageously, this may reduce the power consumption, increase the lifetime of the memory cell, and reduce damage to the memory cell.

In various embodiments, the memory cell 952 is a resistive random access memory cell. In various embodiments, the formation of the state in the memory cell 952 includes a decrease of resistance in the memory cell 952.

In various embodiments, the variable has a predetermined value refers to the variable reaching a predetermined threshold. In various embodiments, the detection circuit 958 is configured such that the variable having a value equal or less than the predetermined threshold will cause the detection circuit 958 to activate the feedback circuit 960 to trigger the switching arrangement 954.

In various embodiments, the switching arrangement 954 includes a transistor. The circuit arrangement 950 may further include a presetting circuit arrangement (not shown in FIG. 9A) in electrical connection to the transistor, the presetting circuit arrangement configured to trigger the transistor, the transistor upon trigger is configured to electrically connect the memory cell 952 to the voltage source during writing.

The circuit arrangement 954 may further include a switching circuit (not shown in FIG. 9A) in electrical connection to the memory cell 952, the switching circuit configured upon trigger to cause the circuit arrangement to write a further state to the memory cell.

FIG. 9B shows a method for writing a state to a memory cell 970 according to various embodiments. In various embodiments, a method for writing a state to a memory cell 970 including providing a potential difference across a first end and a second end of the memory cell to cause formation of the state 972, detecting a variable associated with the formation of the state in the memory cell 974 and limiting the potential difference between the first end and the second end of the memory cell upon detection that the variable has a predetermined value 976.

Figure 9C:
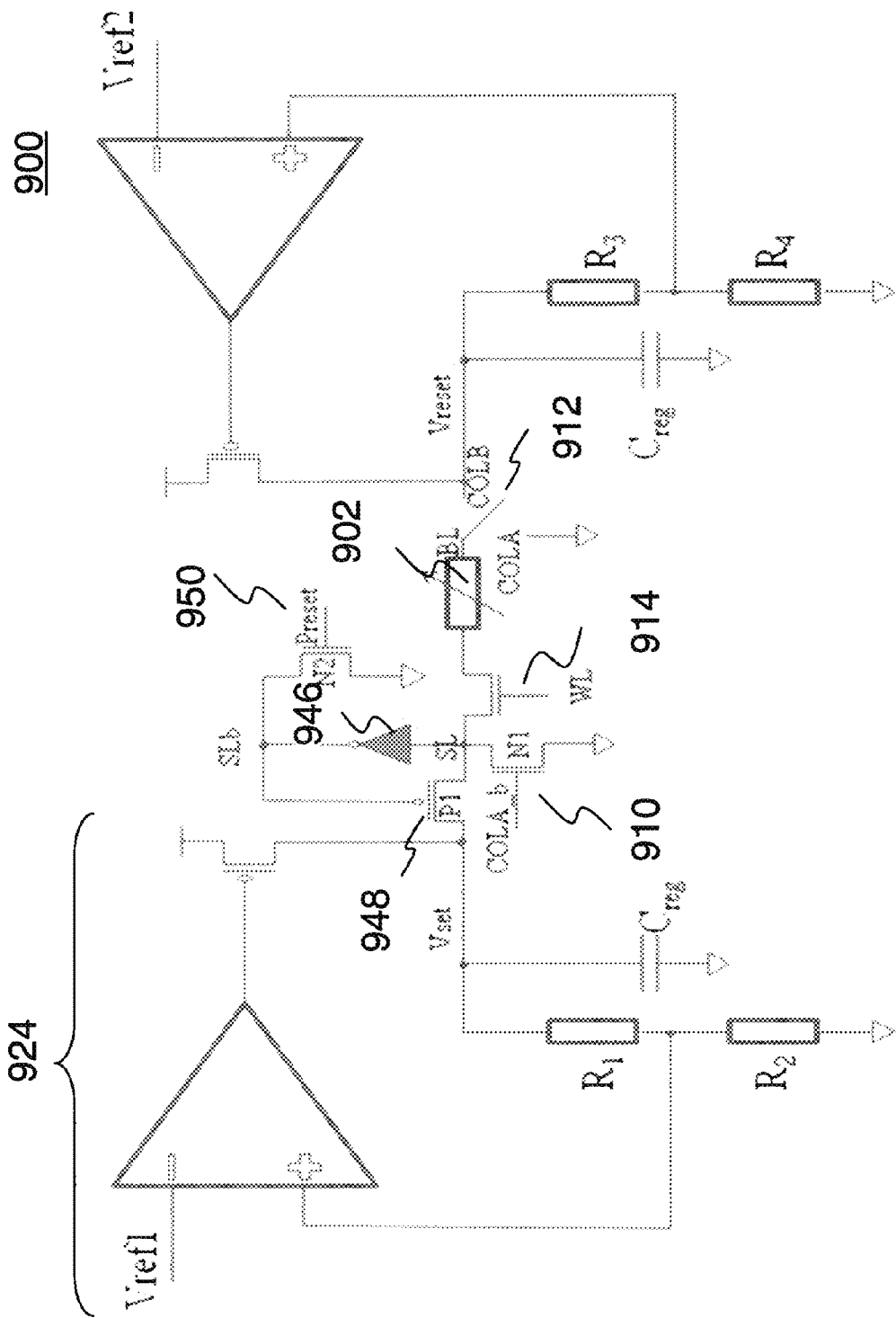
FIG. 9C shows an illustration of a circuit arrangement for writing a state to a memory cell according to various embodiments.

FIG. 9C shows an illustration of a circuit arrangement 900 for writing a state to a memory cell according to various embodiments. FIG. 9 shows a memory cell 902. Upon applying a voltage for writing a state, such as writing a SET state upon application of a COLA signal to the memory cell 902, transistor 910 will be switched off and switch 912 will be set to 0V. The transistor 910 has a controlling terminal configured to receive an external signal (COLA_b), a first controlled terminal set to 0V and a second controlled terminal in electrical connection to a first end of the memory cell 902 via transistor 914. The transistor 910 is switched off by limiting the COLA_b signal.

The transistor 914 is configured to select the particular memory cell 902 for operation and is triggered by application of a voltage at the controlling terminal of the transistor using a word line (WL). When the transistor 914 is in the ON state, it allows current to flow through. Conversely, when the transistor 914 is in the OFF state, it does not allow current to flow through. The transistor 914 is in the ON state during writing of a state to memory cell 902.

It will be understood that a first element is in electrical connection to a second element via a switch or transistor means that when the switch or the transistor is switched on or is in the ON state, a current flows between the first and second elements through the switch or transistor upon application of a potential difference between the first and second elements. However, then the switch or the transistor is switched off or is in the OFF state, no current flows even upon the application of a potential difference between the first and second elements. Also, no current flows when the switch or the transistor is switched on or is in the ON state but there is no potential difference between the first and second elements.

FIG. 9C also shows an inverter 946 having an input terminal in electrical connection to the second controlled terminal of transistor 910 and a transistor 948 having a controlling terminal in electrical connection to the output terminal of inverter 946. The transistor 948 has a first controlled terminal in electrical connection to a first voltage $V_{set}$ provided by voltage regulating circuit arrangement 924 and a second controlled terminal in electrical connection to the memory cell 902 via transistor 914. The second controlled terminal of transistor 948 is also in electrical connection to the second controlled terminal of transistor 910.

Prior to writing the SET state, the transistor 910 is switched on by applying a signal COLA_B to the controlling terminal of transistor 910. The node SL at the second controlled terminal of transistor 910 will be at around 0V. The inverter inverts the voltage at node SL and the voltage at node SLb (ie. the voltage at the controlling terminal of transistor 948) is at high. The transistor 948 is turned off and the transistor 914 is effectively insulated from the voltage $V_{set}$ provided by the voltage regulating circuit arrangement 924. The second end of the memory cell 902 is at $V_{reset}$. Assuming the cell is selected and WL is high, the first end of the memory cell 902 is at about 0V. In such a case, the memory cell is at the RESET state. For the case of a resistive random access memory cell, the resistance of the cell at the RESET state is high.

Once the SET operation commences, transistor 910 will be switched off and switch 912 will be set to about 0V as described above. The second controlled terminal of transistor 910 will no longer be set to about 0V. A preset signal may also be received by transistor 950 through its controlling terminal. The transistor 950 has a first controlled terminal set to ground and a second controlled terminal in electrical connection to the controlling terminal of transistor 948 as well as the output terminal of inverter 946. The transistor 950 is switched on and a pulse of about 0V is outputted to the controlling terminal of transistor 948. The transistor 950 may be configured to be of at other times. The node SL at the second controlled terminal of transistor 910 is set to about $V_{set}$. As the transistor 914 is switched on, the first end of the memory cell is set to about $V_{set}$. The second end of the memory cell is also set to about 0V by switch 912. The inverter inverts the voltage at node SL and keeps the transistor 910 switched on.

In such a manner, the memory cell 902 is being applied with the potential difference between the first end and the second end of the memory cell 902, the potential difference causing formation of the state in the memory cell 902.

Once the SET or low resistance state is formed in the memory cell, the resistance of the memory cell decreases. Accordingly, the voltage at node SL will decrease. The inverter 946 will invert the low voltage at node SL. The voltage at node SLb and the controlling terminal of transistor 948 will be high. The transistor 948 is then switched off. The voltage drop across the controlled terminal of transistor 948 increases, thus effectively insulating the first end of the memory cell 902 from $V_{set}$. In other words, the potential difference between the first end and the second end of the memory cell is limited.

In various embodiments, the switching arrangement may include a transistor 948. In various embodiments, the circuit arrangement 950 may further include a presetting circuit arrangement including transistor 950, the presetting circuit arrangement in electrical connection to the transistor 948, the presetting circuit arrangement configured to trigger the transistor 948, the transistor 948 upon trigger is configured to electrically connect the memory cell to the voltage source during writing. The circuit arrangement may further include a switching circuit including transistor 910 in electrical connection to the memory cell 902, the switching circuit configured upon trigger to cause the circuit arrangement to write a further state to the memory cell. This may happen when for instance when there is a RESET operation upon application of a COLB signal. The transistor 910 will be switched on and the switch 912 will be switched to a voltage of $V_{reset}$. The further state, ie. the reset state will be written on the memory cell 902.

In various embodiments, the variable is a potential difference across the first and second ends of the memory cell 902. When the SET state or low resistance state is formed, the potential difference cross the memory cell 902 decreases to a low resistance voltage as resistance of the memory cell 902 decreases. The detection circuit may include an inverter 946.

In various embodiments, the first voltage or SET voltage may be used to power the inverter. In various embodiments, the inverter 946 is configured in such a way that the threshold voltage of the inverter 946 is lower during than the first voltage or SET voltage but higher than the low resistance voltage.

Figure 10:
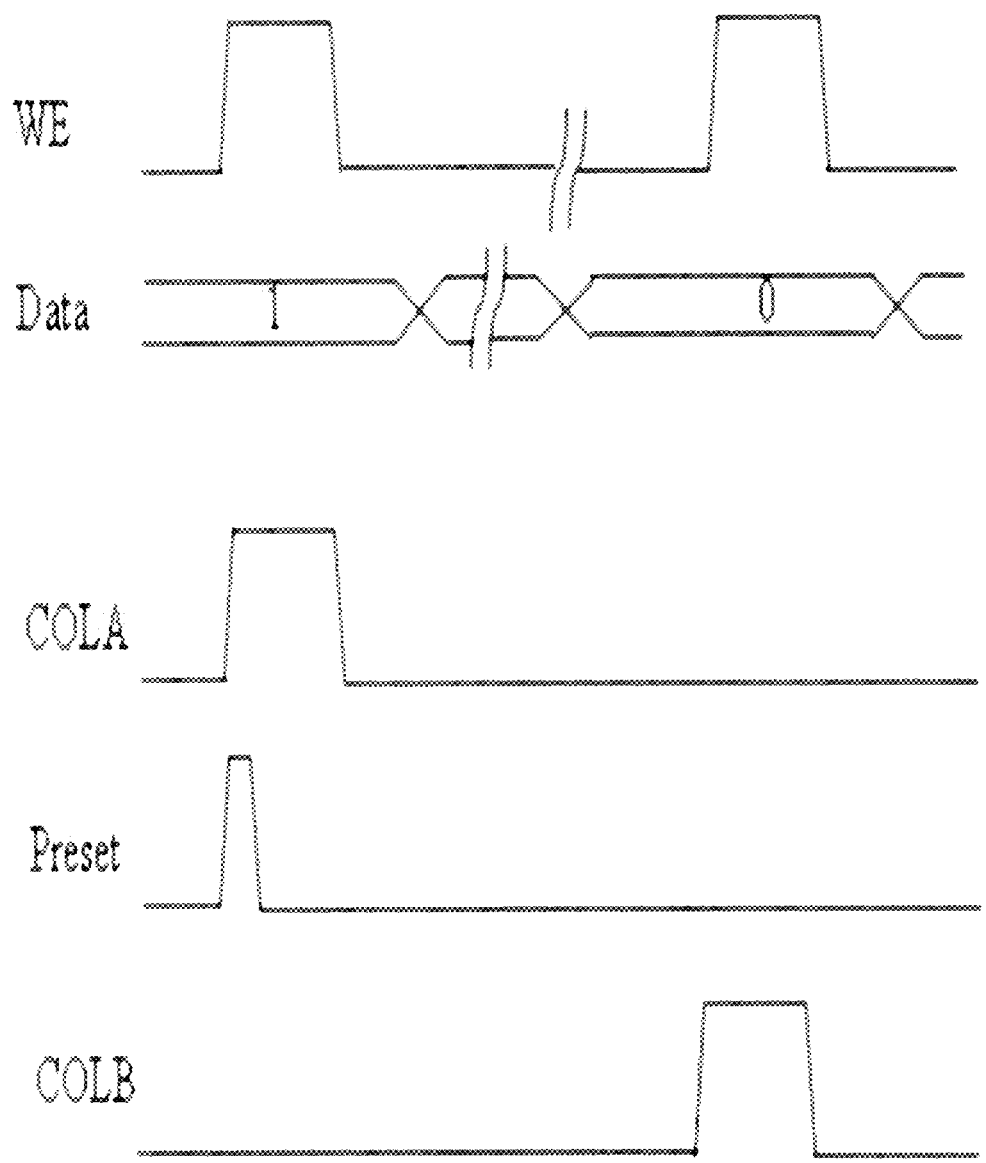
FIG. 10 shows an illustration of timing information for the circuit arrangement in FIG. 9C.
Figure 11:
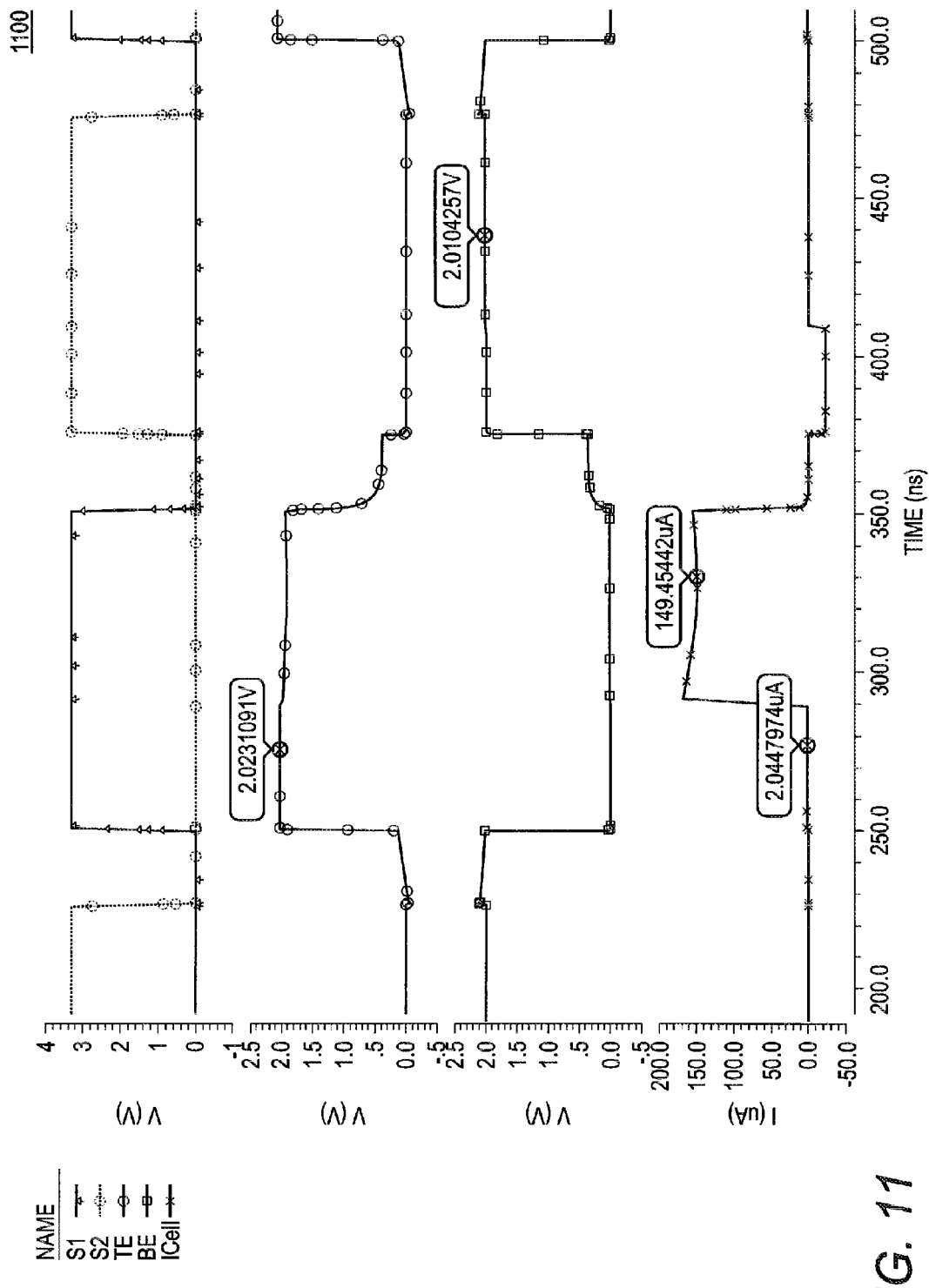
FIG. 11 shows an illustration of stimulation waveform without using the circuit arrangement shown in FIG. 9C.
Figure 12:
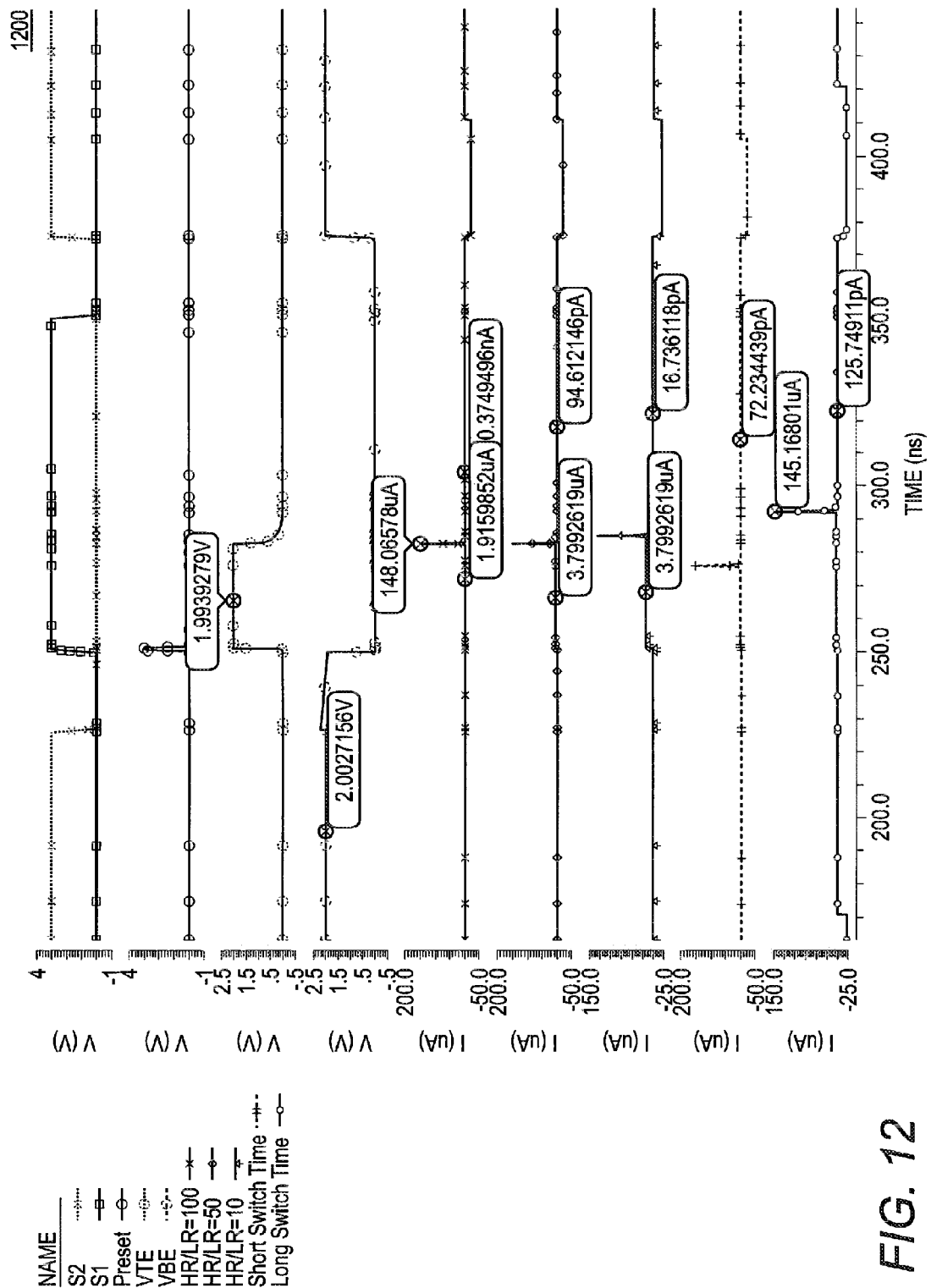
FIG. 12 shows an illustration of stimulation waveform using the circuit arrangement shown in FIG. 9C.

FIG. 10 shows an illustration of timing information 1000 for the circuit arrangement in FIG. 9C, FIG. 11 shows an illustration of stimulation waveform without using the circuit arrangement 1100 shown in FIG. 9C. FIG. 12 shows an illustration of stimulation waveform using the circuit arrangement 1200 shown in FIG. 9C.

In FIG. 11, before the resistance has been changed, the writing current is only 2 uA; however after the resistance has been changed, the writing current is increased to 149 uA. In FIG. 12, before the resistance has been changed, the writing current is 17.46 uA when HR/LR=10, after the resistance has been changed, the current is only 16.73 pA. As also can be seen from FIG. 12, although different cell requires different SET time, the writing circuits still could be turned off immediately after SET operation is finished.

For illustration purposes only and not as a limiting example, the term "substantially" may be quantified as a variance of +/−5% from the exact or actual. For example, the phrase "A is (at least) substantially the same as B" may encompass embodiments where A is exactly the same as B, or where A may be within a variance of +/−5%, for example of a value, of B, or vice versa.

In the context of various embodiments, the term "about" as applied to a numeric value encompasses the exact value and a variance of +/−5 of the value.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A circuit arrangement for writing a first state or a second state to a memory cell comprising:
    a memory cell having a first end and a second end;
    a first electrode in electrical connection with the first end of the memory cell;
    a second electrode in electrical connection with the second end of the memory cell;
    a first switch in electrical connection with the first electrode, the first switch configured to switch between a first voltage and a second voltage; and
    a second switch in electrical connection with the second electrode, the second switch configured to switch between a third voltage and a fourth voltage;
    a voltage regulating circuit arrangement in electrical connection with the first switch configured to generate the first voltage;
    wherein on writing the first state to the memory cell the circuit arrangement is configured such that the first switch electrically connects to the first voltage and the second switch electrically connects to the fourth voltage to apply a first potential difference between the first and second ends of the memory cell, the first potential difference causing formation of the first state in the memory cell; and
    wherein on writing the second state to the memory cell the circuit arrangement is configured such that the first switch electrically connects to the second voltage and the second switch electrically connects to the third voltage to apply a second potential difference between the first and second ends of the memory cell, the second potential difference causing formation of the second state in the memory cell;
    wherein the voltage regulating circuit arrangement comprises
    a transistor having a controlling terminal, a first controlled terminal and a second controlled terminal, the second controlled terminal in electrical connection to the first switch, the first controlled terminal configured to be electrically connected to an unregulated voltage source;
    a differential operational amplifier having an output terminal, a first input terminal and a second input terminal, the output terminal in electrical connection to the controlling terminal of the transistor and the first input terminal is configured to be electrically connected to a reference voltage source;
    a first resistor having a first end and a second end, the first end of the first resistor in electrical connection to the second controlled terminal of the transistor and the second end of the first resistor in electrical connection to the second input terminal of the amplifier;
    a second resistor having a first end and a second end, the first end of the second resistor in electrical connection to the second end of the first resistor and the second end of the second resistor configured to be connected to ground; and
    a capacitor having a first end and a second end, the first end of the capacitor in electrical connection to the first end of the first resistor and the second end of the capacitor configured to be connected to ground;
    wherein the voltage regulating circuit arrangement is configured such that the transistor is triggered by the differential operational amplifier to limit the first voltage generated at the second controlled terminal when the difference between the first voltage and the reference voltage source exceeds a predetermined value.

2. The circuit arrangement according to claim 1 wherein on writing the first state to the memory cell, a first current is generated to flow in a first direction between the first electrode and the second electrode and on writing the second state to the memory cell, a second current is generated to flow in a second direction opposite the first direction between the first electrode and the second electrode.

3. The circuit arrangement according to claim 1 wherein the first potential difference is different from the second potential difference.

4. The circuit arrangement according claim 1 wherein the first voltage is of a positive polarity.

5. The circuit arrangement according to claim 1 wherein the third voltage is of a positive polarity.

6. The circuit arrangement according to claim 1 wherein the second voltage is about 0V.

7. The circuit arrangement according to claim 1 wherein the fourth voltage is about 0V.

8. The circuit arrangement according to claim 1 further comprising a voltage regulating circuit arrangement in electrical connection with the second switch configured to generate the third voltage.

9. The circuit arrangement according to claim 8 wherein the voltage regulating circuit arrangement comprises:
 a transistor having a controlling terminal, a first controlled terminal and a second controlled terminal, the second controlled terminal in electrical connection to the second switch, the first controlled terminal configured to be electrically connected to an unregulated voltage source;
 a differential operational amplifier having an output terminal, a first input terminal and a second input terminal, the output terminal in electrical connection to the controlling terminal of the transistor and the first input terminal is configured to be electrically connected to a reference voltage source;
 a first resistor having a first end and a second end, the first end of the first resistor in electrical connection to the second controlled terminal of the transistor and the second end of the first resistor in electrical connection to the second input terminal of the amplifier;
 a second resistor having a first end and a second end, the first end of the second resistor in electrical connection to the second end of the first resistor and the second end of the second resistor configured to be connected to ground; and
 a capacitor having a first end and a second end, the first end of the capacitor in electrical connection to the first end of the first resistor and the second end of the capacitor configured to be connected to ground;
 wherein the voltage regulating circuit arrangement is configured such that the transistor is triggered by the differential operational amplifier to limit the third voltage generated at the second controlled terminal when the difference between the third voltage and the reference voltage source exceeds a predetermined value.

10. The circuit arrangement according to claim 1 wherein the memory cell is a resistive random access memory cell.

11. A method of writing a first state or a second state to a memory cell wherein writing the first state to the memory cell comprises electrically connecting a first switch, the first switch in electrical connection to a first end of the memory cell, to a first voltage and electrically connecting a second switch, the second switch in electrical connection to a second end of the memory cell, to a fourth voltage to apply a first potential difference between a first and a second end of the memory cell, the first potential difference causing formation of the first state in the memory cell;
 wherein writing the second state to the memory cell comprises electrically connecting the first switch to a second voltage and electrically connecting the second switch to a third voltage to apply a second potential difference between the first and second ends of the memory cell, the second potential difference causing formation of the second state in the memory cell;
 wherein only one state is written to the memory cell at any time;
 wherein a voltage regulating circuit arrangement is in electrical connection with the first switch configured to generate the first voltage; and
 wherein the voltage regulating circuit arrangement comprises:
 a transistor having a controlling terminal, a first controlled terminal and a second controlled terminal, the second controlled terminal in electrical connection to the first switch, the first controlled terminal configured to be electrically connected to an unregulated voltage source;
 a differential operational amplifier having an output terminal, a first input terminal and a second input terminal, the output terminal in electrical connection to the controlling terminal of the transistor and the first input terminal is configured to be electrically connected to a reference voltage source;
 a first resistor having a first end and a second end, the first end of the first resistor in electrical connection to the second controlled terminal of the transistor and the second end of the first resistor in electrical connection to the second input terminal of the amplifier;
 a second resistor having a first end and a second end, the first end of the second resistor in electrical connection to the second end of the first resistor and the second end of the second resistor configured to be connected to ground; and
 a capacitor having a first end and a second end, the first end of the capacitor in electrical connection to the first end of the first resistor and the second end of the capacitor configured to be connected to ground; and
 wherein the voltage regulating circuit arrangement is configured such that the transistor is triggered by the differential operational amplifier to limit the first voltage generated at the second controlled terminal when the difference between the first voltage and the reference voltage source exceeds a predetermined value.

12. A circuit arrangement for writing a state to a memory cell comprising:
 a memory cell having a first end and a second end;
 a switching arrangement in electrical connection with the memory cell, the switching arrangement comprising a transistor;
 a presetting circuit arrangement in electrical connection to the transistor, the presetting circuit arrangement configured to trigger the transistor, the transistor of the switching arrangement upon trigger is configured to electrically connect the memory cell to a voltage source during writing the state to generate a potential difference between the first end and the second end of the memory cell, the potential difference causing formation of the state in the memory cell;
 a detection circuit configured to detect a variable associated with the formation of the state in the memory cell; and
 a feedback circuit arrangement in electrical connection between the detection circuit and the switching arrangement, the feedback circuit configured to trigger the switching arrangement to limit the potential difference between the first end and the second end of the memory cell upon detection by the detection circuit that the variable has a predetermined value.

13. The circuit arrangement according to claim 12 further comprising a switching circuit in electrical connection to the memory cell, the switching circuit configured upon trigger to cause the circuit arrangement to write a further state to the memory cell.

14. The circuit arrangement according to claim 12 wherein the memory cell is a resistive random access memory cell.

15. The circuit arrangement according to claim 14 wherein formation of the state in the memory cell comprises a decrease of resistance in the memory cell.

16. A method for writing a state to a memory cell comprising:
- providing a potential difference across a first end and a second end of the memory cell to cause formation of the state;
- detecting a variable associated with the formation of the state in the memory cell; and
- limiting the potential difference between the first end and the second end of the memory cell upon detection that the variable has a predetermined value;
- wherein the potential difference is generated during writing the state between the first end and the second end of the memory cell by a presetting circuit arrangement in electrical connection to a transistor of a switching arrangement, the transistor upon trigger by the presetting circuit is configured to electrically connect the memory cell to a voltage source.

* * * * *